(12) United States Patent
Nagano (10) Patent No.: US 6,798,370 B1
(45) Date of Patent: Sep. 28, 2004

(54) PARALLEL A/D CONVERTER (75) Inventor: Koichi Nagano, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/418,299

(22) Filed: Apr. 18, 2003

(51) Int. Cl.$^7$ ................................................. H03M 1/12
(52) U.S. Cl. .................................................... 341/155
(58) Field of Search ................................. 341/155, 159, 341/160, 172

(56) References Cited

FOREIGN PATENT DOCUMENTS

| JP | 6-85675 | * | 3/1994 |
|----|---------|---|--------|
| JP | 9-93130 | * | 4/1997 |

* cited by examiner

Primary Examiner—Brian Young
(74) Attorney, Agent, or Firm—McDermott Will & Emery LLP (57) ABSTRACT

A parallel A/D converter includes: a reference-voltage generation circuit for outputting m reference voltages ("m" is an integer of not less than two), each having different voltage values, in response to the bit precision of digital output signals; n comparators ("n" is an integer smaller than "m"); and an encoder for encoding outputs of the n comparators to output the digital output signals. Each of the n comparators compares the magnitude of one of the m reference voltages with that of an analog input signal. Thereby, power consumption can be reduced.

14 Claims, 12 Drawing Sheets

PARALLEL A/D CONVERTER

BACKGROUND OF THE INVENTION

The present invention relates to a parallel A/D converter.

An A/D converter is used for converting analog input signals into digital output signals when a communication device or recording/reproducing device reproduces signals. The A/D converter outputs digital output signals encoded in response to the levels of analog input signals.

Figure 12:
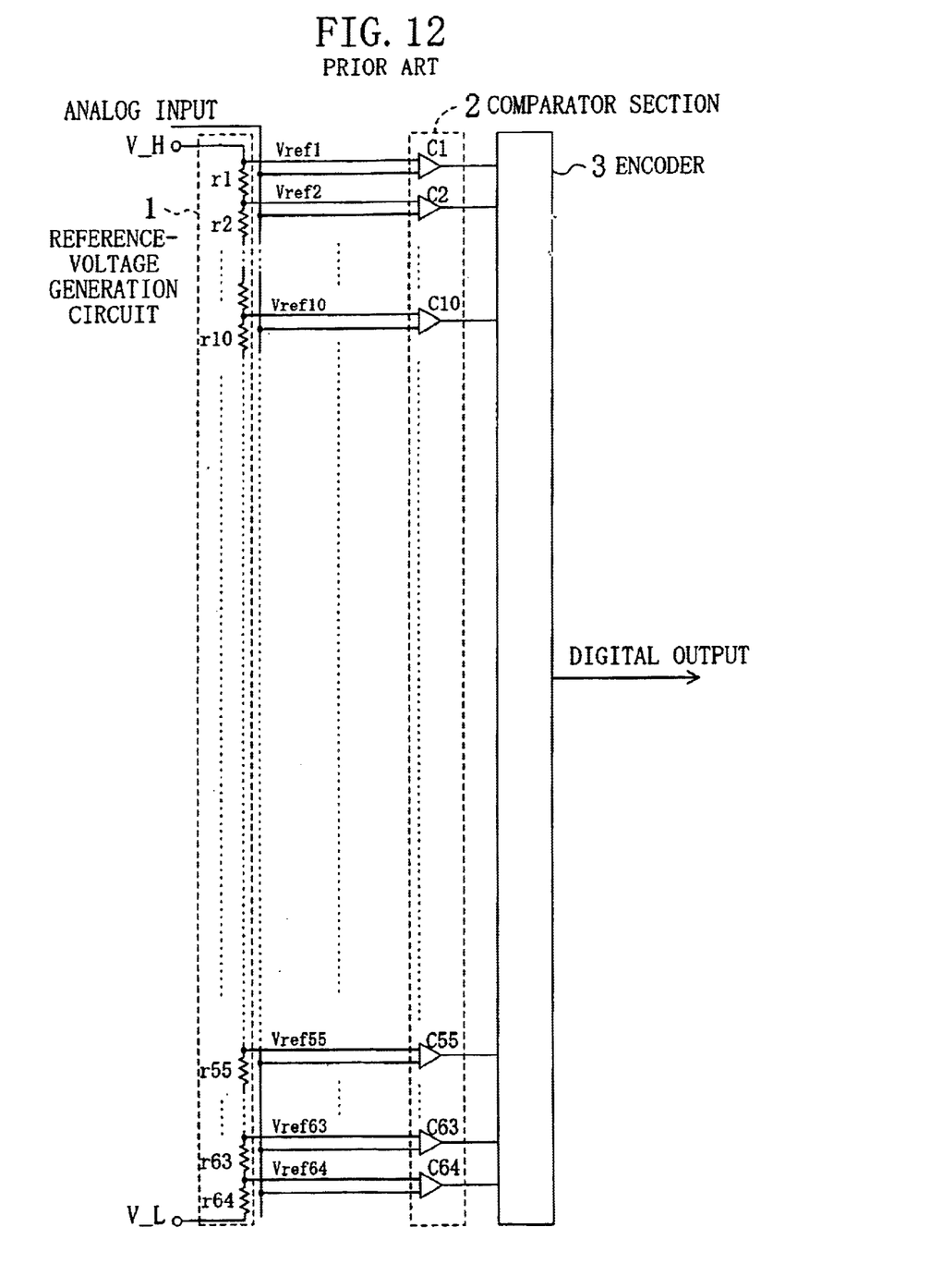
FIG. 12 illustrates a configuration example of a conventional A/D converter.

FIG. 12 illustrates a basic configuration example of a conventional 6-bit parallel A/D converter 120. The parallel A/D converter 120 shown in FIG. 12 is formed from a reference-voltage generation circuit 1, a comparator section 2 and an encoder 3.

The reference-voltage generation circuit 1 includes reference resistors r1 to r64. The reference resistors r1 to r64 are connected in series between a node for receiving an upper-limit reference voltage V_H and a node for receiving a lower-limit reference voltage V_L. The reference-voltage generation circuit 1 outputs $2^6$ reference voltages Vref1 to Vref64 in response to bit precision. The comparator section 2 includes 64 comparators C1 to C64. The comparators C1 to C64 compare the magnitude of the respective reference voltages Vref1 to Vref64 with that of analog input signal to output a binary signal ("1" or "0") in response to the magnitude. The encoder 3 encodes the outputs of the comparators C1 to C64 to output 6-bit digital output signals.

The conventional parallel A/D converter 120 is thus formed to enable analog input signals to be converted into desired digital output signals.

As described above, according to the conventional parallel A/D converter 120, the comparators C1 to C64 are provided in response to the reference voltages Vref1 to Vref64 of which the number depends on bit precision. Accordingly, with the bit precision being increased, the number of comparators is multiplied, and the circuit scale is increased. This results in increase of power consumption.

SUMMARY OF THE INVENTION

An object of the present invention is to provide a parallel A/D converter capable of reducing power consumption.

Specifically, a first parallel A/D converter of the present invention includes: a reference-voltage generation circuit for outputting m reference voltages ("m" is an integer of not less than two), each having different voltage values, in response to the bit precision of digital output signals; n comparators ("n" is an integer smaller than "m"); and an encoder for encoding outputs of the n comparators to output the digital output signals, wherein each of the n comparators compares the magnitude of one of the m reference voltages with that of an analog input signal.

According to the first parallel A/D converter of the present invention, the number of the comparators is n ("n" is smaller than "m"). Accordingly, compared to a conventional A/D converter, the circuit scale is reduced smaller, thereby enabling power consumption to be reduced.

Preferably, in the first parallel A/D converter of the present invention, the n reference voltages to be compared by the n comparators are symmetric with respect to a mean value of the reference voltages.

With this configuration, since the n reference voltages to be compared by the n comparators are symmetric with respect to a mean value of the reference voltages, power consumption can be reduced with the A/D conversion precision being maintained.

Preferably, in the first parallel A/D converter of the present invention, the reference-voltage generation circuit includes m reference resisters serially connected between a node for receiving an upper-limit reference voltage and a node for receiving a lower-limit reference voltage, the parallel A/D converter further includes m-n loads corresponding to m-n reference voltages, which do not correspond to the n comparators, among the m reference voltages, and each of the m-n loads is connected between a node for outputting the corresponding reference voltage and a node for receiving the analog input signal.

With this configuration, since the parallel A/D converter further includes m-n loads corresponding to m-n reference voltages, which do not correspond to the n comparators, among the m reference voltages, the linearity of reference voltage values are improved. Consequently, the A/D conversion precision can be improved.

Preferably, the first parallel A/D converter of the present invention further includes: a comparator for comparing the magnitude of any of a plurality of reference voltages and that of the analog input signal, the plurality of reference voltages appearing between one reference voltage among n reference voltages corresponding to the n comparators and a reference voltage, which is next large or small following the one reference voltage, among the n reference voltages.

With this configuration, conversion error aggravation can be mitigated even when noise and other influences take place, consequently enabling the A/D conversion precision to be improved.

Preferably, the first parallel A/D converter of the present invention further includes: p comparators corresponding to p reference voltages in response to bit precision to be secured among a plurality of reference voltages appearing between one reference voltage of n reference voltages corresponding to the n comparators and a reference voltage, which is next large or small following the one reference voltage, among the n reference voltages, wherein each of the p comparators compares the magnitude of the corresponding reference voltage with that of the analog input signal.

With this configuration, the bit precision can be secured, consequently enabling the A/D conversion precision to be improved.

Preferably, in the first parallel A/D converter of the present invention, the encoder encodes m inputs to output digital output signals, the m inputs include n inputs derived as inputs from outputs of the n comparators corresponding to the n reference voltages, and m-n inputs corresponding to m-n reference voltages, which do not correspond to the n comparators, among the m reference voltages, and each of the m-n inputs is derived as an input from an output of a comparator corresponding to a reference voltage, which is next large following a reference voltage corresponding to the input, among the n reference voltages.

With this configuration, the encoder having the same configuration as that of a conventional encoder can be used, consequently obviating the necessity of redesigning the encoder.

Preferably, in the first parallel A/D converter of the present invention, n reference voltages to be compared by the n comparators correspond to a voltage level distribution of the analog input signal.

With this configuration, the system-optimizing comparators can be set.

Preferably, in the first parallel A/D converter of the present invention, the analog input signal is a reproduction signal of a recording/reproducing device.

Preferably, in the first parallel A/D converter of the present invention, the n reference voltages to be compared by the n comparators correspond to appearance frequencies of the digital output signals.

Preferably, in the first parallel A/ID converter of the present invention, the n reference voltages to be compared by the n comparators correspond to characteristics of a communication line of a communication device that transmits the analog input signal.

A second parallel A/D converter of the present invention includes: a reference-voltage generation circuit for outputting m reference voltages ("m" is an integer of not less than two), each having different voltage values, in response to the bit precision of digital output signals; m comparators, provided in correspondence with the m reference voltages, each comparing the magnitude of the corresponding reference voltage with that of an analog input signal; n switch devices ("n" is an integer smaller than "m"), provided in correspondence with n reference voltages of the m reference voltages, each controlling the supply of the reference voltage and the analog input signal to the corresponding comparator; and an encoder for encoding outputs of the m comparators to output the digital output signals.

According to the second parallel A/D converter of the present invention, since the n switch devices are provided, only desired signals can be compared. This enables power consumption to be reduced, and further enables the system-optimizing comparators to be used.

Preferably, the second parallel A/D converter of the present invention further includes: a gain control circuit for outputting a control signal upon stabilization of the amplitude of the analog input signal, wherein each of the n switch devices stops the supply of the reference voltage and the analog input signal to the corresponding comparator in response to the control signal.

With this configuration, the A/D conversion characteristics can be switched in response to the stability of the amplitude of the analog input signal, consequently enabling the use of the system-optimizing comparators. In addition, upon stabilization of the timing thereof, comparators connected to the corresponding switch devices are not used, consequently enabling power consumption to be reduced.

Preferably, the second parallel A/D converter of the present invention further includes: a timing control circuit for outputting a control signal upon stabilization of the timing of sampling the analog input signal, wherein each of the n switch devices stops the supply of the reference voltage and the analog input signal to the corresponding comparator in response to the control signal.

With this configuration, the A/D conversion characteristics can be switched in response to the stability of the timing of sampling the analog input signal, consequently enabling the use of the system-optimizing comparators. In addition, upon stabilization of the timing thereof, comparators connected to the corresponding switch devices are not used, consequently enabling power consumption to be reduced.

A third parallel A/D converter of the present invention includes: a reference-voltage generation circuit for outputting m reference voltages ("m" is an integer of not less than two), each having different voltage values, in response to the bit precision of digital output signals; m comparators, provided in correspondence with the m reference voltages, each comparing the magnitude of the corresponding reference voltage with that of an analog input signal; m switch devices, provided in correspondence with the m reference voltages, each controlling the supply of the reference voltage and the analog input signal to the corresponding comparator; a frequency distribution circuit for outputting a control signal on the basis of a frequency distribution of appearance frequencies of the digital output signals; and an encoder for encoding outputs of the m comparators to output the digital output signals, wherein each of the m switch devices stops the supply of the reference voltage and the analog input signal to the corresponding comparator in response to the control signal.

According to the third parallel A/D converter, the A/D conversion characteristics can be switched in response to the frequency distribution of the appearance frequencies of the digital output signals, and the system-optimizing comparators can be used.

DETAILED DESCRIPTION OF THE INVENTION

Hereinafter, each embodiment of the present invention will be described with reference to the drawings.

Hereinafter, in the drawings for describing each embodiment, common components are denoted by the same reference numerals; therefore, the detailed description thereof will not be repeated.

Embodiment 1

Figure 1:
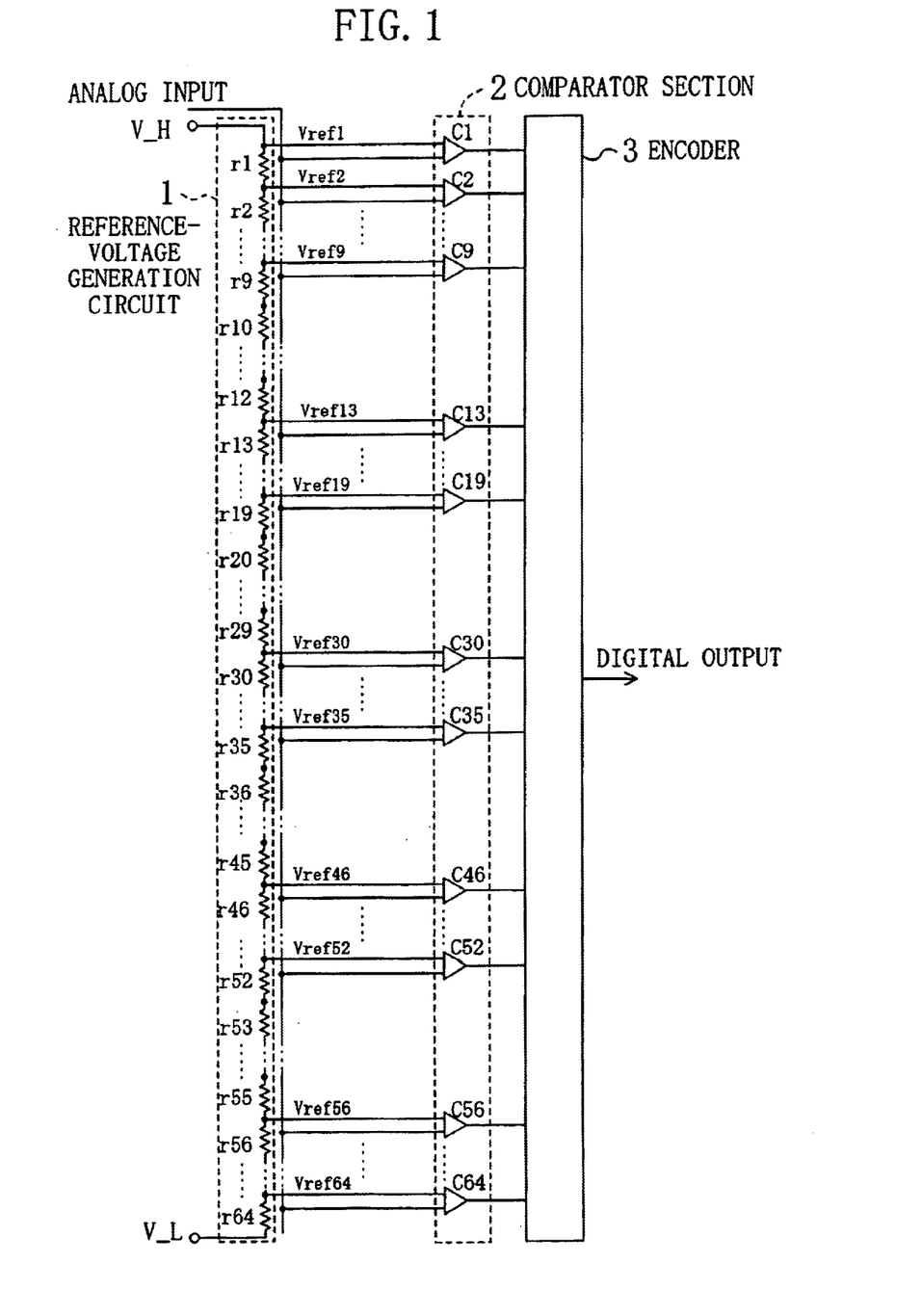
FIG. 1 illustrates a configuration example of a parallel A/D converter according to a first embodiment of the present invention.

FIG. 1 illustrates a configuration example of a parallel A/D converter 10 according to a first embodiment of the present invention, which is used as, for example, 6-bit parallel A/D converter. The parallel A/D converter 10 shown in FIG. 1 is formed from a reference-voltage generation circuit 1, a comparator section 2 and an encoder 3.

The reference-voltage generation circuit 1 is positioned at an initial stage of the parallel A/D converter 10, and includes reference $2^6$ resistors r1 to r64. The reference resistors r1 to r64 are connected in series between a node for receiving an upper-limit reference voltage V_H and a node for receiving a lower-limit reference voltage V_L. The reference-voltage generation circuit 1 outputs voltages of interconnected nodes of the reference resistors in the form of reference voltages. More specifically, the reference-voltage generation circuit 1 outputs reference voltages Vref1 to Vref64, of which the number ($2^6$) in response to the bit precision. The comparator section 2 includes comparators C1 to C9, C13 to C19, C30 to C35, C46 to C52, and C56 to C64 (hereinafter, simply referred to as "respective comparators C-1"). The respective comparators C-1 compare the magnitude of reference voltages Vref1 to Vref9, Vref13 to Vref19, Vref30 to Vref35, Vref46 to Vref52, and Vref56 to Vref64 (hereinafter, simply referred to as "respective reference voltages V-1") outputted from the interconnected nodes of the reference resisters r1 to r64 with the magnitude of the analog input signal to output a binary signal ("1" or "0") in response to the magnitude. The encoder 3 encodes the outputs of the respective comparators C-1 to output digital output signals.

Unlike the conventional parallel A/D converter 120 in which the comparators C1 to C64 are provided in correspondence with the reference voltages Vref1 to Vref64, the parallel A/D converter 10 according to the present embodiment has such a configuration that the respective comparators C-1 are provided in correspondence with the respective reference voltages V-1 among the reference voltages Vref1 to Vref64.

Description will be given of specific operations of the parallel A/D converter 10, having the above-described configuration, according to the present embodiment.

As shown in FIG. 1, in the comparator section 2, the respective comparators C-1 provided in correspondence with the respective reference voltages V-1 compare the magnitude of the respective reference voltages V-1 inputted to the respective comparators C-1, respectively, with the magnitude of the analog input signal as described above. Unlike the conventional parallel A/D converter 120, in the parallel A/D converter 10 according to the present embodiment, the respective comparators C-1 corresponding to the respective reference voltages V-1 among the reference voltages Vref1 to Vref64 compare the magnitude of the respective reference voltages V-1 with that of the analog input signal.

Herein, when the analog input signal has a value close to those of the reference voltages Vref10 to Vref12, Vref20 to Vref29, Vref36 to Vref45, and Vref53 to Vref55 (hereinafter, simply referred to as "respective reference voltages V-2") to which the respective comparators C-1 are not connected, it is impossible to perform digital conversion having the same precision as the conventional parallel A/D converter 120, so that the performance of the parallel A/D converter 10 according to the present embodiment deteriorates.

However, when the analog input signal has a value close to those of the respective reference voltages V-1 to which the respective comparators C-1 is connected, it is possible to perform digital conversion having the same precision as the conventional parallel A/D converter 120 Specifically, in portions where no input frequency of an analog input signal takes place or reference voltages (the respective reference voltages V-2, for example) are of small values, such comparators connected in the portions the conventional parallel A/D converter 120 as the comparators C10 to C12, C20 to C29, C36 to C45, and C53 to C55 (hereinafter, simply referred to as "respective comparators C-2") are not necessary. As such, the circuit scale can be reduced by forming the parallel A/D converter 10 according to the present embodiment without providing the unnecessary respective comparators C-2. Consequently, power consumption can be reduced.

In addition, in a parallel A/D converter used in a communication device or a recording/reproducing device, a phenomenon takes place in which data to be inputted to the parallel A/D converter frequently generates in a range close to predetermined values. This phenomenon works to enable the parallel A/D converter 10 according to the present embodiment to be used in a signal processing system such as a communication device or a recording/reproducing device.

Figure 2:
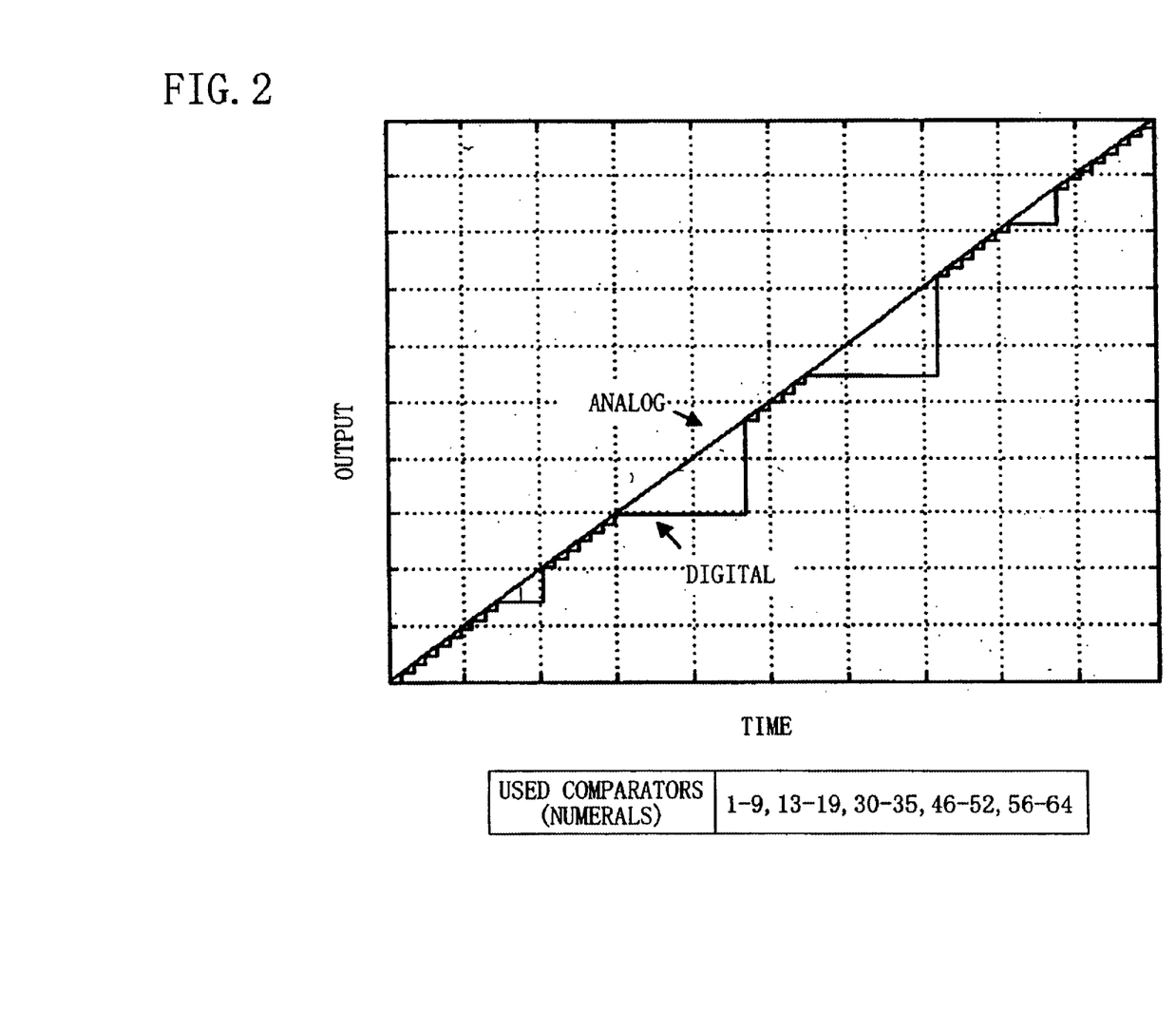
FIG. 2 is a graph showing conversion characteristics of the parallel A/D converter according to the first embodiment of the present invention.

FIG. 2 is a graph showing conversion characteristics of the parallel A/D converter 10 described above. "Used Comparators (Numerals)" shown in a lower portion of FIG. 2 are the reference numerals of the used comparators counted from the comparator C1 for inputting the upper-limit reference voltage at the one end of the reference-voltage generation circuit 1 shown in FIG. 1. The numerals shown in the figure correspond to the respective comparators C-1 shown in FIG. 1. With the comparator section 2 having the configuration as described above being provided, the configuration is formed in which the used comparators are partly present with respect to the entirety, as shown in FIG. 1. In this configuration, the parallel A/D converter 10 according to the present embodiment exhibits conversion characteristics as shown in FIG. 2, and the conversion characteristics allow portions not caused linear to occur.

Figure 3:
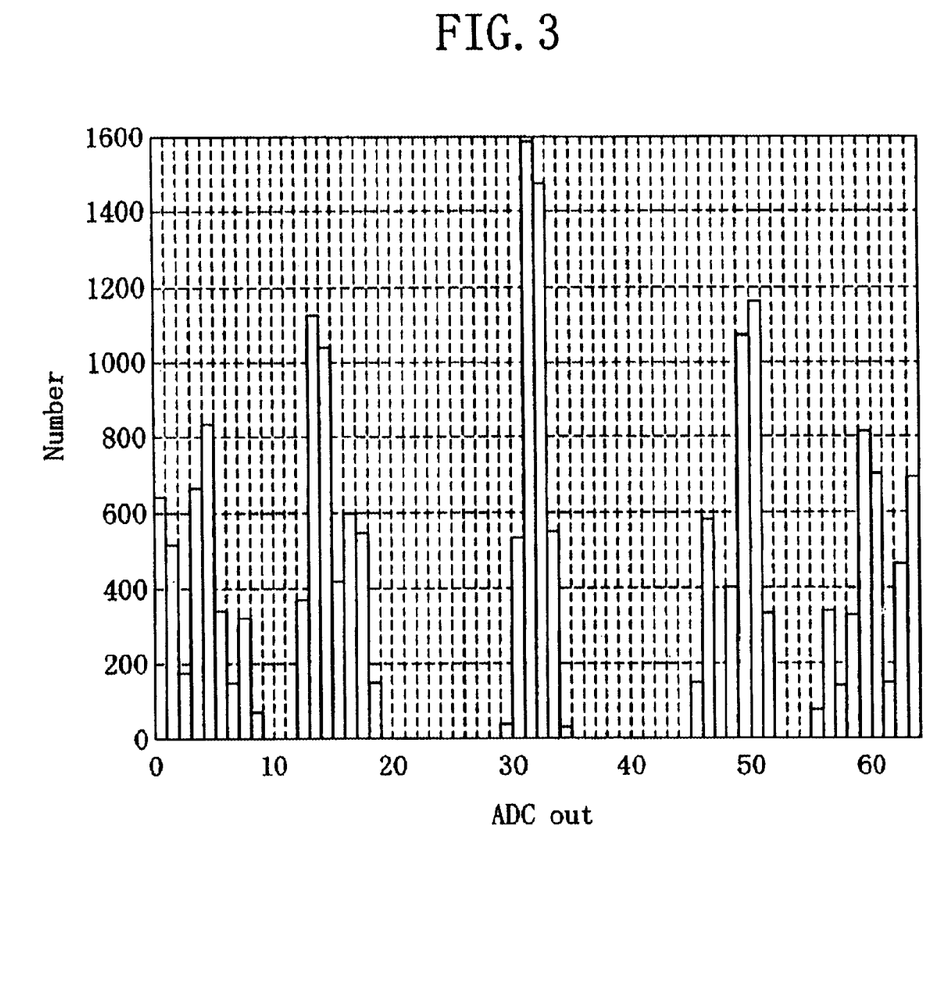
FIG. 3 is a histogram showing the numbers of appearances of digital outputs of the parallel A/D converter according to the first embodiment of the present invention.

FIG. 3 is a histogram showing the numbers of appearances of digital data A/D converted by the conventional parallel A/D converter 120. The histogram of FIG. 3 shows an example of data of reproduction signals in a recording/reproducing device. For such data, the comparator section 2 is caused effective by being provided with the respective comparators C-1 having the configuration shown in FIG. 2. In specific, even in a case where the parallel A/D converter 10 of the present invention having conversion characteristics as shown in FIG. 2, the A/D conversion performance is not deteriorated. The reason therefor is that in this case, as can be seen from FIG. 3, the respective comparators C-1 are connected to portions where the numbers of appearances of digital data take place. More specifically, the reason therefor is that an analog input signal to be inputted is of a value close to values of the respective reference voltages V-1 to which the respective comparators C-1 are connected.

In addition, as described above, the parallel A/D converter 10 according to the present embodiment is configured to have the respective comparators C-1 corresponding to the respective reference voltages V-1 among the reference resistors r1 to r64. In this case, the respective comparators C-1 to be provided in the comparator section 2 are connected symmetric with respect to a mean value of the reference voltages Vref1 to Vref64 outputted from the respective reference resistors r1 to r64, respectively. This manner of connection enables the power consumption to be reduced with the A/D conversion precision being maintained.

As described above, the parallel A/D converter 10 according to the present embodiment has the respective comparators C-1 in correspondence with the respective reference voltages V-1 among the reference voltages Vref1 to Vref64. For this reason, the circuit scale can be reduced, consequently enabling power consumption to be reduced.

Embodiment 2

Figure 4:
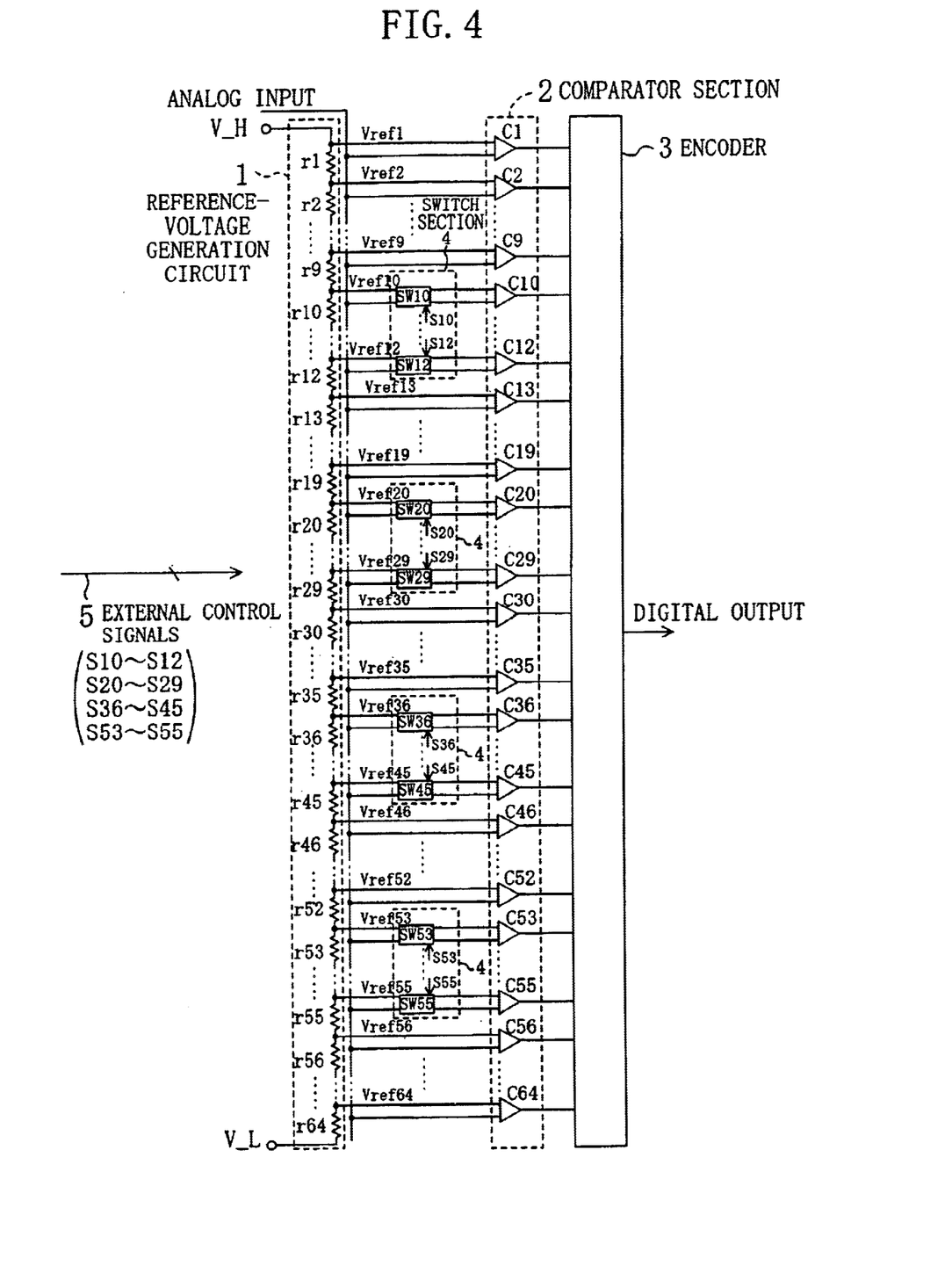
FIG. 4 illustrates a configuration example of a parallel A/D converter according to a second embodiment of the present invention.

FIG. 4 illustrates a configuration example of a parallel A/D converter 20 according to a second embodiment of the present invention, which is used as, for example, a 6-bit parallel A/D converter. The parallel A/D converter 20 shown in FIG. 4 includes switch sections 4, in addition to the constituent elements shown in FIG. 1. In addition, unlike the configuration of the first embodiment, a comparator section 2 is formed from a plurality of comparators C1 to C64 that compare the magnitude of respective reference voltages Vref1 to Vref64 with the magnitude of an analog input signal. Further, the switch sections 4 include a plurality of switches SW10 to SW12, SW20 to SW29, SW36 to SW45, and SW53 to SW55 (hereinafter simply referred to as "respective switches SW-1"). The respective switches SW-1 control switch operations in accordance with external control signals S10 to S12, S20 to S29, S36 to S45, and S53 to S55 (hereinafter, simply referred to as "external control signals 5"). The respective switches SW-1 are connected to the corresponding respective comparators C-1, respectively.

The conversion characteristics of the parallel A/D converter 20 can be switched in accordance with control performed by the respective switches SW-1 for the switch operations in response to the external control signals 5. More specifically, the parallel A/D converter 20 according to the present embodiment is capable of selecting either of the conversion characteristics according to the conventional parallel A/D converter 120 and the conversion characteristics according to the parallel A/D converter 10 described in the first embodiment. By way of an example application case, when the parallel A/D converter 20 is used in the recording/reproducing device or the communication device, the respective switches SW-1 receive the external control signals 5, and stop the supply of the corresponding reference voltages to the comparators C1 to C64. Thereby, only the respective comparators C-1 are used to compare respective reference voltages Vref1 to Vref64 with an analog input signal, and the conversion characteristics according to the parallel A/D converter 10 described in the first embodiment are obtained.

As described above, with the provision of the switch sections 4 in response to the external control signals 5, the parallel A/D converter 20 according to the present embodiment can switch the conversion characteristics thereof. Thereby, the system-optimizing comparators are can be used depending on the use purpose of the parallel A/D converter 20, consequently enabling implementation of reduction in power consumption and the A/D conversion performance suitable depending on the use purpose.

Embodiment 3

Figure 5:
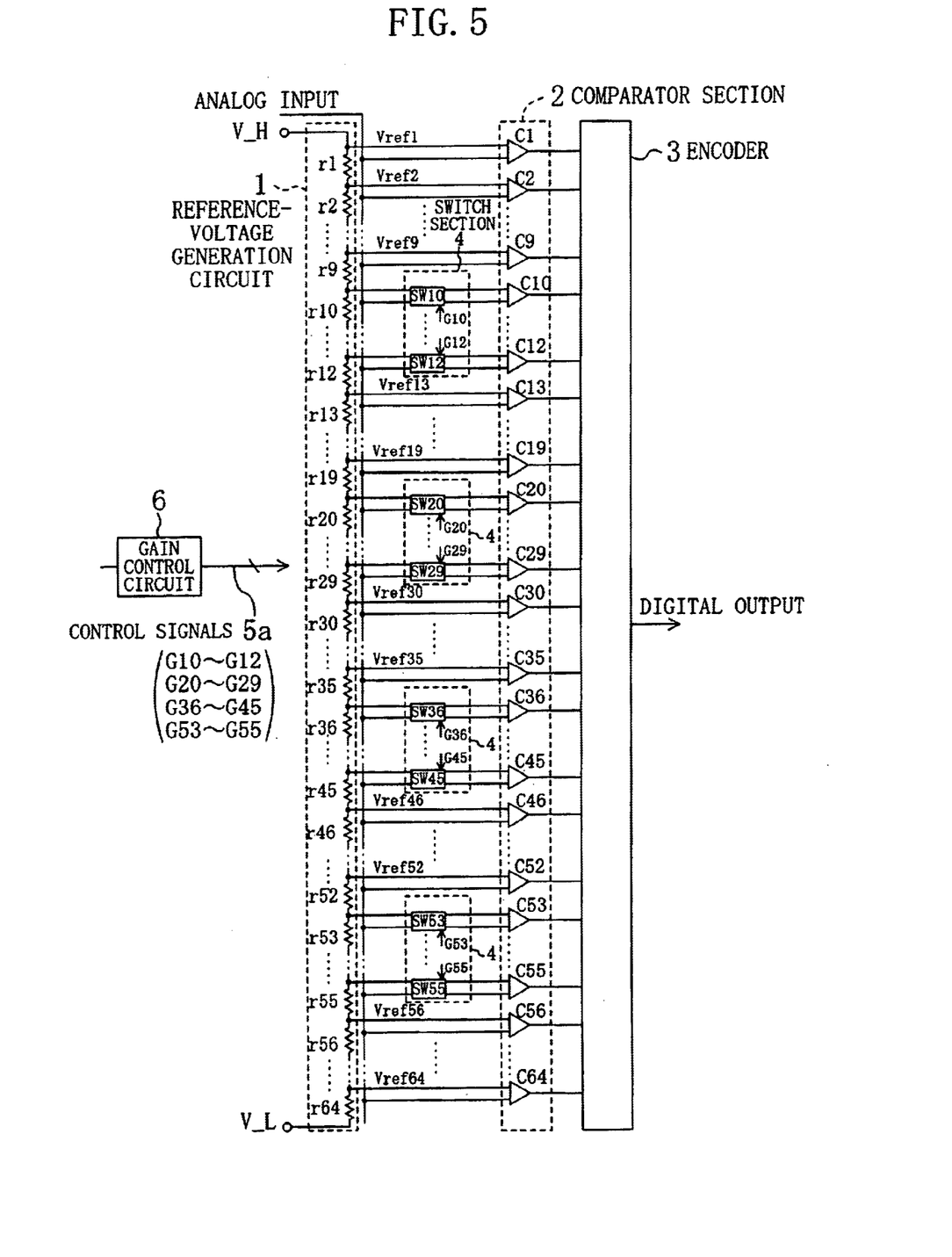
FIG. 5 illustrates a configuration example of a parallel A/D converter according to a third embodiment of the present invention.

FIG. 5 illustrates a configuration example of a parallel A/D converter 30 according to a third embodiment of the present invention, which is used as, for example, a 6-bit parallel A/D converter. The parallel A/D converter 30 shown in FIG. 5 further includes a gain control circuit 6 that outputs amplitude stabilization signals G10 to G12, G20 to G29, G36 to G45, and G53 to G55 (hereinafter, simply referred to as "control signals 5a"), in addition to the constituent elements shown in FIG. 4.

An inherent use purpose of the gain control circuit 6 is to maintain amplitudes of signals inputted to the system to be constant. Specifically, the circuit 6 is to output an amplitude stabilization signal that increases the amplitude when it is small or that decreases the amplitude when it is large.

Upon stabilization of the amplitude of the analog input signal to predetermined values, the gain control circuit 6 outputs the amplitude stabilization signals to the switch sections 4. In response to the control signals 5a, the respective switches SW-1 stop the supply of the corresponding reference voltages V-2 and the analog input signal to the corresponding comparators C-2.

For example, in a case where A/D conversion produces digital outputs in the form of data distribution as shown in FIG. 3, effective characteristics cannot be obtained with the parallel A/D converter 10 according to the first embodiment being used before the data amplitudes are stabilized to predetermined values. The reason is that in the state where the data amplitudes are not stabilized, suppose A/D conversion is performed in the manner that comparisons are performed using, for example, the comparator section 2 that performs comparisons only in portions where the respective comparators C-1 are set. In this case, however, when an analog input signal is concurrently inputted to, for example, portions where the respective comparators C-2 are set, A/D conversion for the analog input signal cannot be performed. Consequently, the A/D conversion performance is reduced. As such, in order to obtain the conversion characteristics of the parallel A/D converter 10 according to the first embodiment, when the amplitude of the analog input signal is stabilized to a predetermined value, the control signals 5a are outputted from the gain control circuit 6. Then, in response to the outputs, the respective switches SW-1 stop the supply of the corresponding reference voltages V-2 and the analog input signal to the corresponding comparators C-2. According to this arrangement, the conversion characteristics of the conventional parallel A/D converter 120 can be obtained before the data amplitudes are stabilized constant. On the other hand, the conversion characteristics of the parallel A/D converter 10 according to the first embodiment can be obtained upon stabilization of the amplitudes to be constant.

Thus, upon stabilization of the digital data amplitudes, the parallel A/D converter 30 according to the present embodiment outputs the control signals 5a (amplitude stabilization signals) through the gain control circuit 6. Then, in response to the control signals 5a, the switch sections 4 stop the supply of the corresponding reference voltages V-2 and the analog input signal to the respective comparators C-2. Thereby, the parallel A/D converter 30 according to the present embodiment can switch the conversion characteristics thereof in accordance with the stability of digital data Consequently, the system-optimizing comparators can be set and used. Furthermore, after the data amplitude is stabilized to be constant, since the respective comparators C-2 connected to the respective switches SW-1 are not used, power consumption can be reduced.

Embodiment 4

Figure 6:
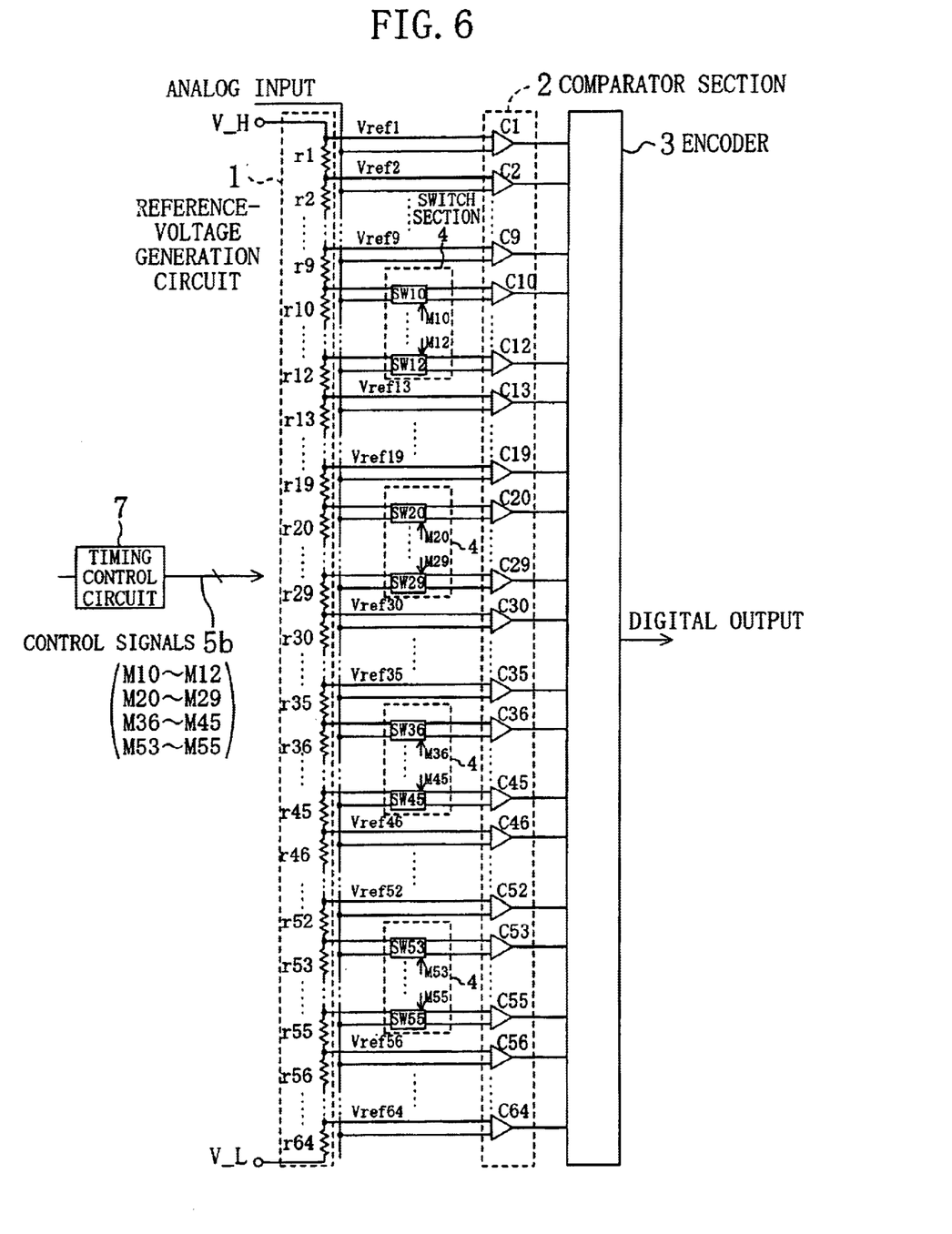
FIG. 6 illustrates a configuration example of a parallel A/D converter according to a fourth embodiment of the present invention.

FIG. 6 illustrates a configuration example of a parallel A/D converter 40 according to a fourth embodiment of the present invention, which is used as, for example, 6-bit parallel A/D converter. The parallel A/D converter 40 shown in FIG. 6 further includes a timing control circuit 7 that outputs timing stabilization signals M10 to M12, M20 to M29, M36 to M45, and M53 to M55 (hereinafter, simply referred to as "control signals 5b"), in addition to the constituent elements shown in FIG. 4.

An inherent use purpose of the timing control circuit 7 is to maintain timing of sampling the signal to be inputted to the system constant.

The timing control circuit 7 is configured such that when sampling timing is stabilized, timing stabilization signals are outputted as the control signals 5b, and the supply of the corresponding reference voltages V-2 and the analog input signal to the corresponding comparators C-2 is stopped in response to the control signals 5b.

Similar to the case of the third embodiment, in a case where A/D conversion produces digital outputs in the form of data distribution as shown in FIG. 3, effective characteristics cannot be obtained with the parallel A/D converter 10 according to the first embodiment being used before the data amplitudes are stabilized to predetermined values. The reason is that in the state where the sampling timing is not stabilized, suppose A/D conversion is performed in the manner that comparisons are performed using, for example, the comparator section 2 that performs comparisons only in portions where the respective comparators C-1 are set. In this case, however, when an analog input signal is concurrently inputted to portions where the respective comparators C-2 are set, A/D conversion for the analog input signal cannot be implemented. Consequently, the A/D conversion performance deteriorates.

As such, in order to obtain the conversion characteristics of the parallel A/D converter 10 according to the first embodiment, when the amplitude of the analog input signal is stabilized to a predetermined value, the control signals 5b are outputted from the timing control circuit 7. Then, in response to the outputs, the respective switches SW-1 stop the supply of the respective reference voltages V-2 and the analog input signal to the respective comparators C-2. According to this arrangement, the conversion characteristics of the conventional parallel A/D converter 120 can be secured before the data amplitudes are stabilized constant. On the other hand, the conversion characteristics of the parallel A/D converter 10 according to the first embodiment can be secured upon stabilization of the timing to be constant.

Thus, upon stabilization of the sampling timing of the analog input signal, the parallel A/D converter 40 according to the present embodiment outputs the control signals 5b (timing stabilization signals). Then, in response to the control signals 5b, the respective switches SW-1 stop the supply of the respective reference voltages V-2 and the analog input signal to the respective comparators C-2. Thereby, the parallel A/D converter 40 according to the present embodiment can switch the conversion characteristics thereof in response to stability of the sampling timing of the analog input signal. Consequently, the system-optimizing comparators can be used. Furthermore, after the data amplitude is stabilized constant, since the respective comparators C-2 connected to the respective switches SW-1 are not used, power consumption can be reduced.

Embodiment 5

Figure 7:
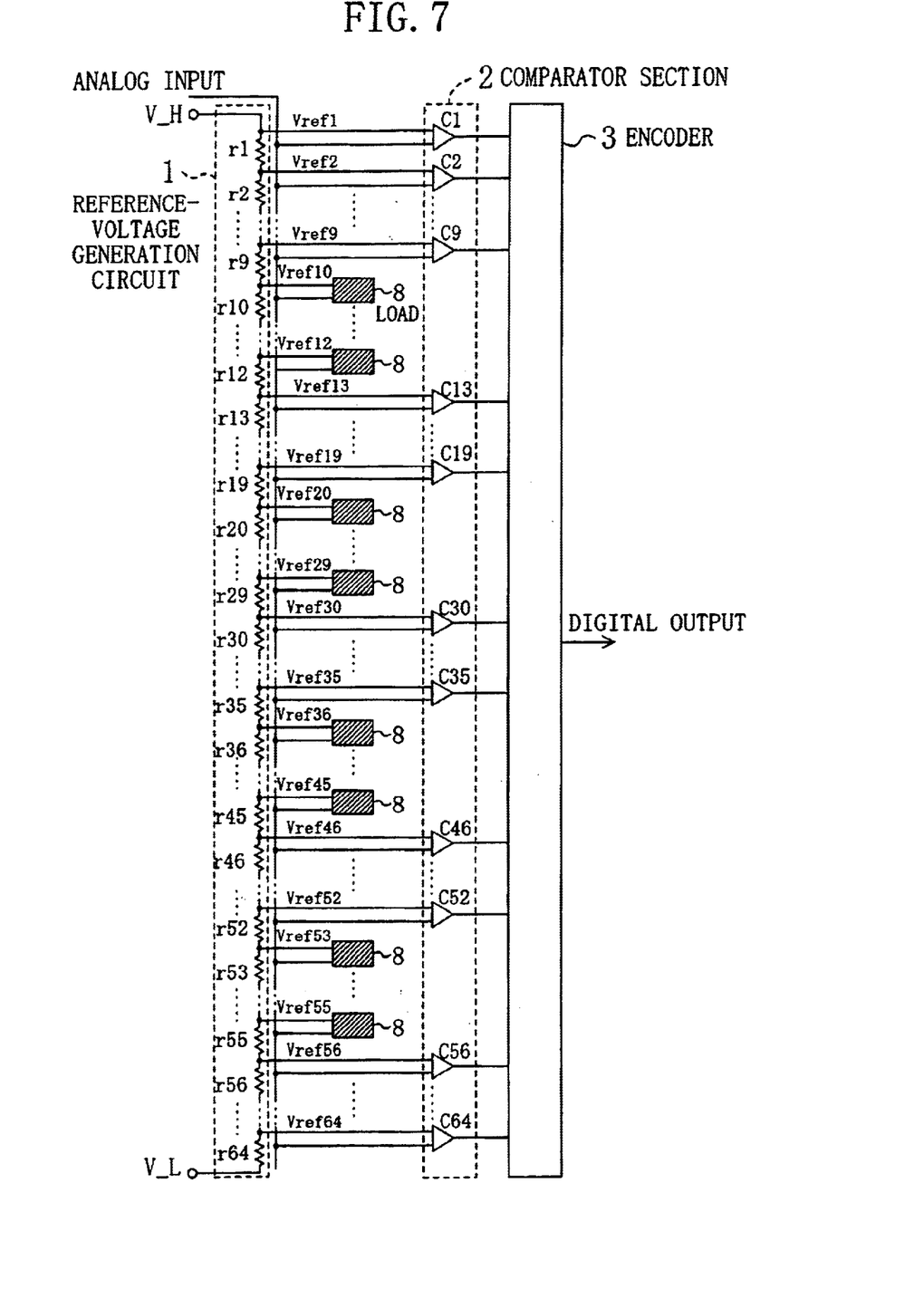
FIG. 7 illustrates a configuration example of a parallel A/D converter according to a fifth embodiment of the present invention.

FIG. 7 illustrates a configuration example of a parallel A/D converter 50 according to a fifth embodiment of the present invention, which is used as, for example, a 6-bit parallel A/D converter. The parallel A/D converter 50 shown in FIG. 7 further includes loads 8 in addition to the constituent elements shown in FIG. 1.

In the parallel A/D converter 10 having the configuration shown in FIG. 1, the reference resistors r1 to r64 in the reference-voltage generation circuit 1 include the portions of the reference voltages V-1 to which the comparators C-1 are respectively connected and the portions of the reference voltages V-2 to which the respective comparators C-1 are not connected. The respective comparators C-1 corresponding to the respective reference voltages V-1 have loads, such as a capacitor and a resistor. For this reason, the linearity of the respective reference voltages Vref1 to Vref64 are reduced because of the presence of the portions of the reference voltages V-1 to which the respective comparators C-1 are connected and the portions of the reference voltages V-2 to which the respective comparators C-2 are not connected. As such, in order to maintain the linearity of the reference voltages Vref1 to Vref64, the loads 8 are provided that have the same values as resistance values and capacitance values of the respective comparators C-1. Specifically, each of the loads 8 is connected between a node for outputting the respective reference voltages V-2, to which the respective comparators C-1 are not connected, and a node for receiving the analog input signal, to which the respective comparators C-1 are connected.

Thus, according to the present embodiment, the loads 8 having the same values as resistance values and capacitance values of the corresponding comparators C-1 are connected between the respective nodes for outputting the respective reference voltages V-2, to which the corresponding comparators C-1 are not connected, and the respective nodes for receiving the analog input signal, to which the respective comparators C-1 are connected. Thereby, since the linearity of the respective reference voltages Vref1 to Vref64 are improved, A/D conversion performance with high accuracy can be implemented, and further, reduction in power consumption can be implemented.

Embodiment 6

Figure 8:
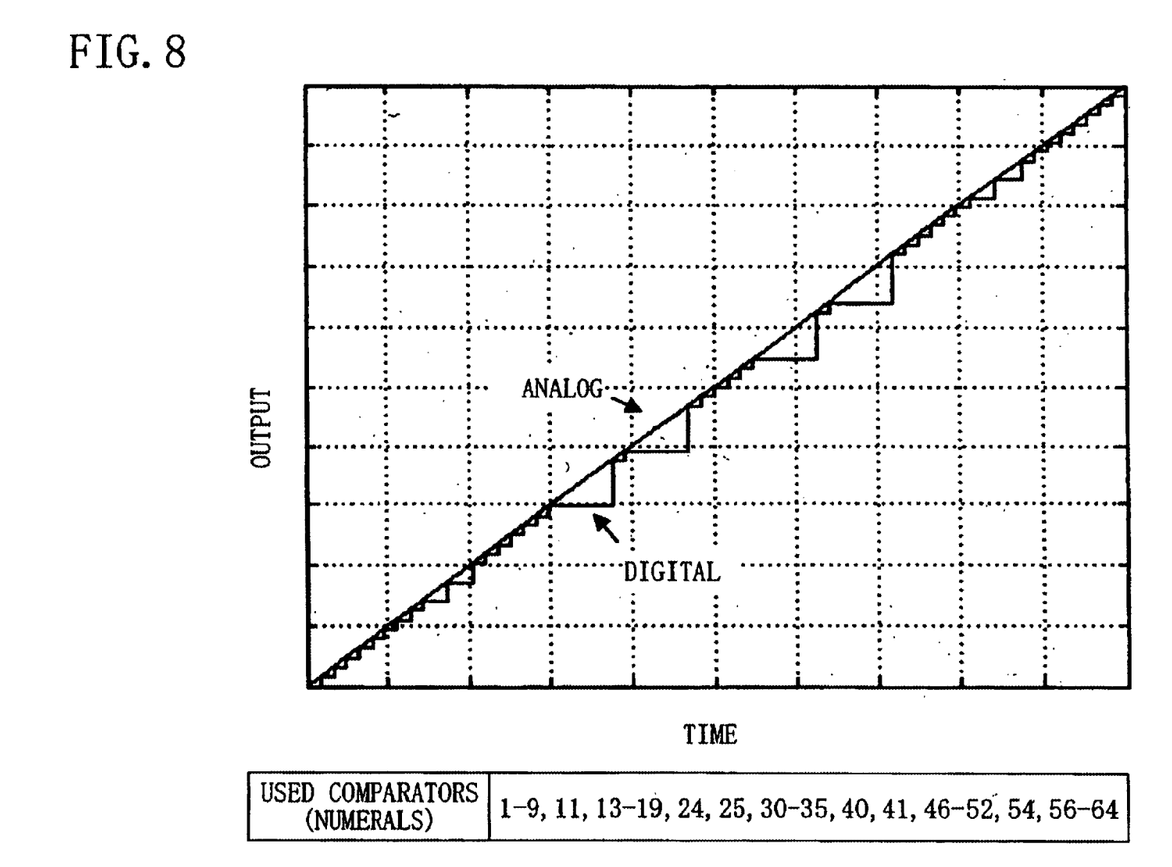
FIG. 8 is a graph showing conversion characteristics of a parallel A/D converter according to a sixth embodiment of the present invention.
Figure 9:
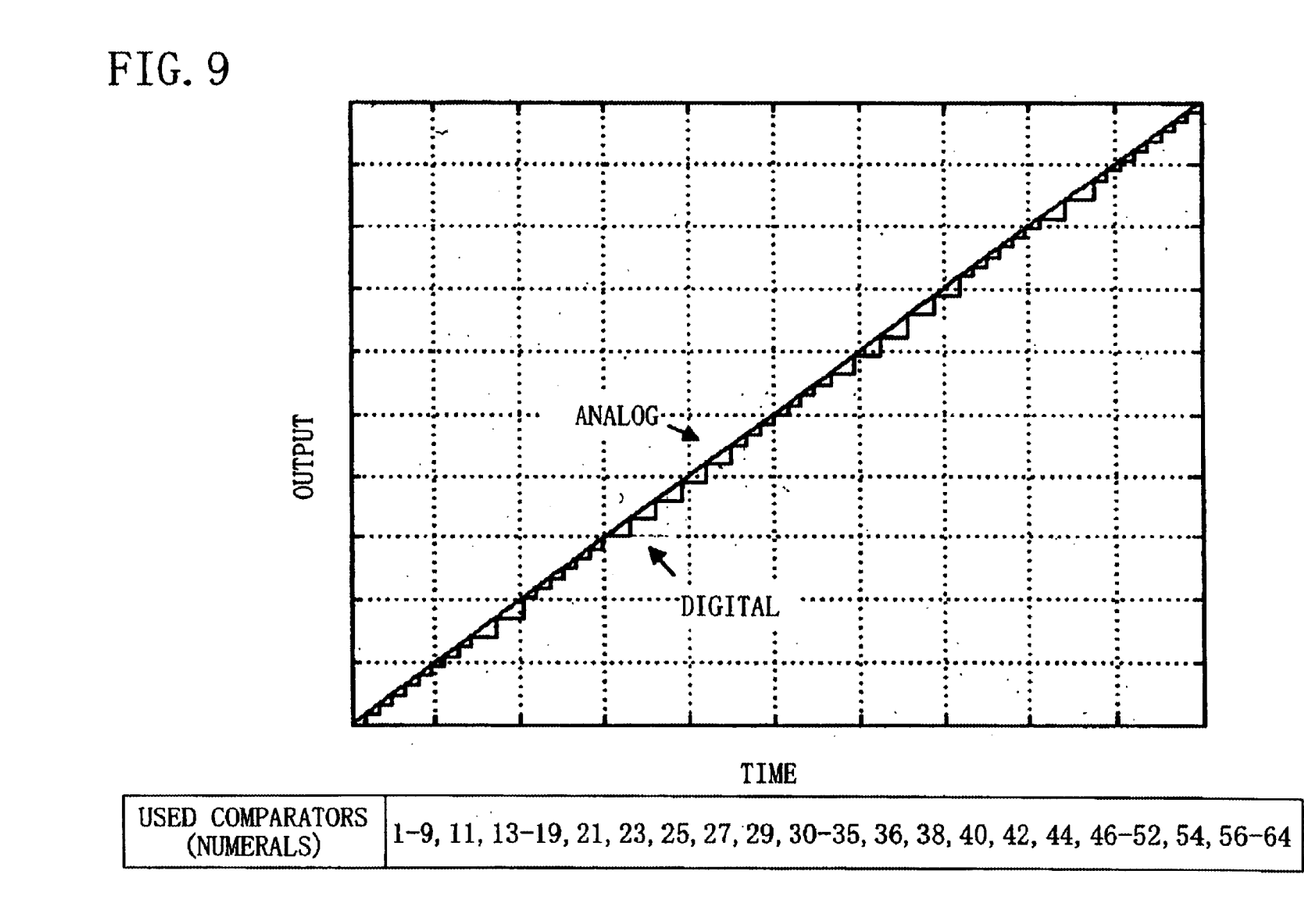
FIG. 9 is a graph showing conversion characteristics of the parallel A/D converter according to the sixth embodiment of the present invention.

FIGS. 8 and 9 respectively show conversion characteristics of a parallel A/D converter 60A and a parallel A/D converter 60B according to a sixth embodiment. The converters 60A and 60B are used as, for example, 6-bit parallel A/D converters and are configured using mutually different comparators. "Used comparators (numerals)" shown in a lower portion of each of FIGS. 8 and 9 are the reference numerals of the used comparators counted from the comparator C1 for inputting the upper-limit reference voltage V_H at the one end of the reference-voltage generation circuit 1 shown in FIG. 1. The configuration has the comparators in partial portions with respect to the entirety, wherein comparator not having reference numerals are not set. With the configurations thus arranged, the parallel A/D converters 60A and 60B exhibit the respective conversion characteristics as shown in FIGS. 8 and 9, and nonlinear portions partially occur in the conversion characteristics.

As shown in the field "Used Comparators (Numerals)" of FIG. 8, in the comparator section 2 of the parallel A/D converter 60A, comparators are set to mean values (for example, one or two portions) of reference voltages not inputted to the comparators, in addition to the respective comparators C-1 shown in FIG. 2. By way of one or two portions corresponding to mean values of reference voltages not inputted to the comparators, new comparators C11, C24, C25, C40, C41, C54, and C55 are added. Ordinarily, in a parallel A/D converter used with a communication device or a recording/reproducing device, a value of an analog input signal to be inputted is not of a value close to a reference voltage corresponding to a portion where a comparator is not provided.

However, the value can be an undesired input signal value because of influences of noise and others. In this case, in the parallel A/D converter 10 having the comparator section 2 configured as shown in FIG. 2, the conversion error is aggravated, thereby reducing the performance of the overall system. As such, the configuration is arranged as that of parallel A/D converter 60A shown in FIG. 8 to enable conversion error aggravation to be minimized.

In addition, for example, as shown in "used comparators (numerals)" in the lower portion of FIG. 9, necessary comparators are added to the respective comparators C-1 shown in FIG. 2. Thereby, the configuration is arranged to be the parallel A/D converter 60B in order to secure the minimum bit precision. "Used Comparators (Numerals)" in a lower portion of FIG. 9 applies to a configuration for securing 5-bit precision.

Thus, according to the present embodiment, the parallel A/D converters 60A and 60B respectively include the comparator sections 2 formed from the comparators shown in respective FIGS. 8 and 9. Thereby, even when noise and/or other influences take place, the conversion error aggravation can be minimized, and the minimum bit precision can be secured. Consequently, high-accuracy A/D conversion can be implemented, and concurrently, power consumption can be reduced.

Embodiment 7

Figure 10:
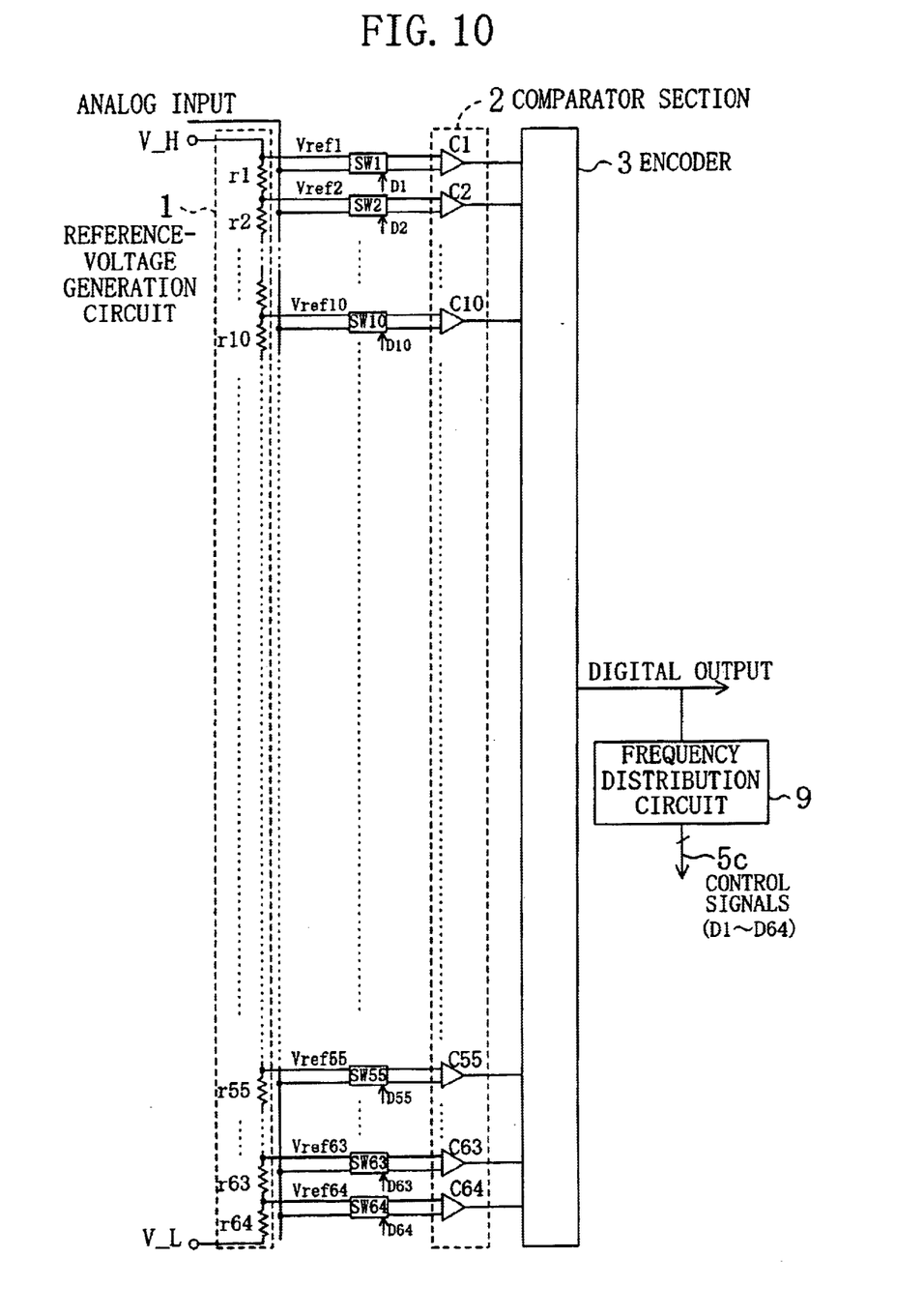
FIG. 10 illustrates a configuration example of a parallel A/D converter according to a seventh embodiment of the present invention.

FIG. 10 illustrates a configuration example of a parallel A/D converter 70 according to a seventh embodiment of the present invention, which is used as, for example, a 6-bit parallel A/D converter. The parallel A/D converter 70 shown in FIG. 10 further includes a frequency distribution circuit 9 and a switch section 4a, in addition to the constituent elements shown in FIG. 1.

The comparator section 2 includes comparators C1 to C64 corresponding to the respective reference voltages Vref1 to Vref64 outputted from the reference-voltage generation circuit 1.

The switch section 4a includes a plurality of switches SW1 to SW64 (switch device) for controlling switch operations in accordance with respective control signals 5C described below. The switches SW1 to SW64 are connected to all the comparators C1 to C64 that correspond to the respective reference voltages Vref1 to Vref64, respectively.

The frequency distribution circuit 9 outputs control signals D1 to D64 (hereinafter, simply referred to as "control signals 5c") in accordance with, for example, a frequency distribution as shown in FIG. 3, which indicates the numbers of appearances of digital output signals. In response to the control signals 5c, the plurality of switches SW1 to SW64 stop the supply of corresponding reference voltages and analog input signal to the comparators C1 to C64. That is, in response to the corresponding control signals 5c, the plurality of switches SW1 to SW64 stop the supply of the corresponding reference voltages and analog input signal to the comparators in portions in each of which the number of appearances exceeds a predetermined number of appearances. This makes the parallel A/D converter in which the corresponding reference voltages and the analog input signal are supplied only to the comparators in portions in each of which the number of appearances exceeds the predetermined number of appearances. In the configuration exhibiting the distribution shown in FIG. 3, configuration supplies the corresponding reference voltages and the analog input signal to the respective comparators C-1 in portions where the numbers of appearances have been detected. On the other hand, however, the configuration stops the supply of the corresponding reference voltages the analog input signal to the respective comparators C-2 in portions where the numbers of appearances are not detected.

For example, in a case where communication lines, transmission lines are not identifiable, the characteristics of an analog input signal cannot be known. In this case, using the frequency distribution circuit 9 and the switch sections 4 as described above enables the arrangement of a parallel A/D converter as the parallel A/D converter 70 that enables the optimal use of the comparators corresponding to the characteristics of the analog input signal.

Thus, according to the parallel A/D converter 70 of the embodiment, the frequency distribution circuit 9 outputs the control signals 5c in accordance with the frequency distribution of the numbers of appearances (appearance frequencies) of digital output signals. In response to the control signals 5c, the switch section 4a controls the supply of the reference voltages and the analog input signal to the corresponding comparators C1 to C64. This arrangement enables the system-optimizing comparators to be used, and enables the optimal A/D conversion performance to be implemented. Consequently, power consumption can be reduced.

Embodiment 8

Figure 11:
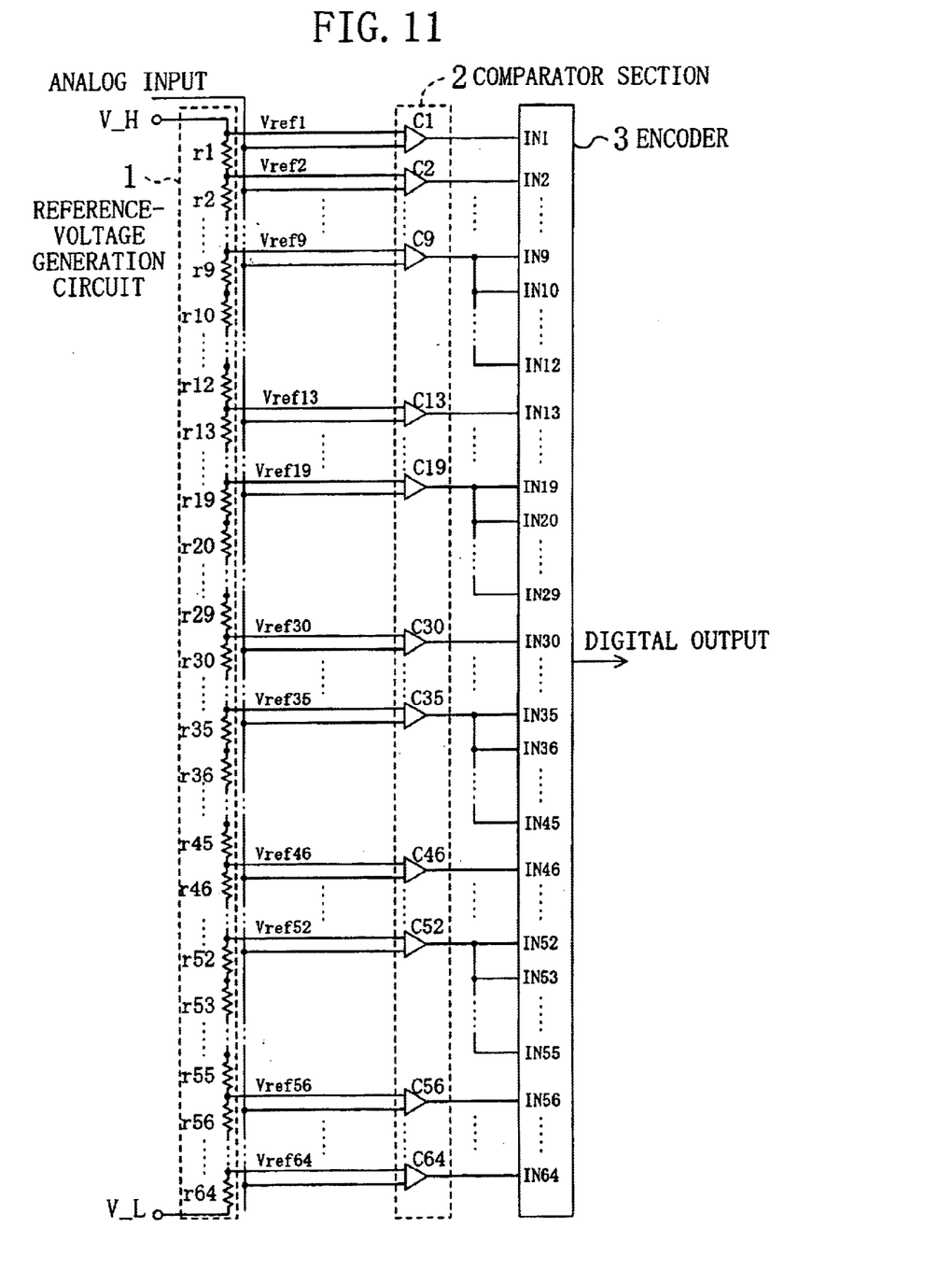
FIG. 11 illustrates a configuration example of a parallel A/D converter according to an eighth embodiment of the present invention.

FIG. 11 illustrates a configuration example of a parallel A/D converter 80 according to an eighth embodiment of the present invention, which is used as, for example, a 6-bit parallel A/D converter. The parallel A/D converter 80 shown in FIG. 11 has constituent elements either identical or different in aspects described later from the constituent elements shown in FIG. 1.

The encoder of the conventional parallel A/D converter 120 shown in FIG. 12 inputs the outputs from the comparators C1 to C64 corresponding to the reference voltages Vref1 to Vref64. However, In the configuration having the encoder 3 shown in FIG. 1, inputs (IN10 to IN12, IN15 to IN29, IN36 to IN45, and IN53 to IN55) for the encoder 3 corresponding to the portions where comparators are not provided corresponding to respective reference voltages V-2 do not use outputs from corresponding comparators as inputs to the encoder 3, dissimilar to the cases of inputs (IN1 to IN9, IN13 to IN19, IN30 to IN35, IN46 to IN52, and IN56 to IN64) for the encoder 3 corresponding to the portions where the comparators are provided. Thus, the encoder 3 shown in FIG. 1 is different from the conventional encoder 3.

However, as shown in FIG. 11, the arrangement is made such that the output from the comparator for the respective reference voltages V-1 for which the corresponding comparator is present and which is next large following than the reference voltage V-1 for which the corresponding comparator is not present is connected to the input portions (IN10 to IN12, IN20 to IN29, IN36 to IN45, and IN53 to IN55) where inputs are not connected to the encoder 3 (for example, the output from the comparator C9 is inputted to the input portions IN10 to IN12). This arrangement enables the encoder 3 having the same configuration as the conventional encoder 3 to be used, consequently avoiding the necessity of redesigning the encoder 3.

Thus, according to the embodiment, the parallel A/D converter 80 of the present invention is configured to input the respective output from the comparator for the reference voltage V-1 for which the corresponding comparator (such as the respective C-1) is present and which is next large following the reference voltage V-1 for which the corresponding comparator is not present is connected to the input portions (IN10 to IN12, IN15 to IN29, IN36 to IN45, and IN53 to IN55) where inputs are not connected to the encoder 3 (for example, the output from the comparator C9 is inputted to the input portions IN10 to IN12). Thereby, the encoder 3 having the same configuration as the conventional encoder 3 can be used. Consequently, the encoder 3 need not be redesigned, and power consumption can be reduced.

What is claimed is:

1. A parallel A/D converter comprising:
   a reference-voltage generation circuit for outputting m reference voltages ("m" is an integer of not less than two), each having different voltage values, in response to the bit precision of digital output signals;

n comparators ("n" is an integer smaller than "m"); and an encoder for encoding outputs of the n comparators to output the digital output signals, wherein each of the n comparators compares the magnitude of one of the m reference voltages with that of an analog input signal, and wherein each of said n comparators is coupled to a single, fixed reference voltage.

2. The parallel A/D converter of claim 1, wherein the n reference voltages to be compared by the n comparators are symmetric with respect to a mean value of the reference voltages.

3. The parallel A/D converter of claim 1, wherein the reference-voltage generation circuit includes m reference resisters serially connected between a node for receiving an upper-limit reference voltage and a node for receiving a lower-limit reference voltage, the parallel A/D converter further comprises m-n loads corresponding to m-n reference voltages, which do not correspond to the n comparators, among the m reference voltages, and each of the m-n loads is connected between a node for outputting the corresponding reference voltage and a node for receiving the analog input signal.

4. The parallel A/D converter of claim 1, further comprising:

a comparator for comparing the magnitude of any of a plurality of reference voltages and that of the analog input signal, the plurality of reference voltages appearing between one reference voltage among n reference voltages corresponding to the n comparators and a reference voltage, which is next large or small following the one reference voltage, among the n reference voltages.

5. The parallel A/D converter of claim 1, further comprising:

p comparators corresponding to p reference voltages in response to bit precision to be secured among a plurality of reference voltages appearing between one reference voltage of n reference voltages corresponding to the n comparators and a reference voltage, which is next large or small following the one reference voltage, among the n reference voltages, wherein each of the p comparators compares the magnitude of the corresponding reference voltage with that of the analog input signal.

6. The parallel A/D converter of claim 1, wherein the encoder encodes m inputs to output digital output signals, the m inputs include n inputs derived as inputs from outputs of the n comparators corresponding to the n reference voltages, and m-n inputs corresponding to m-n reference voltages, which do not correspond to the n comparators, among the m reference voltages, and each of the m-n inputs is derived as an input from an output of a comparator corresponding to a reference voltage, which is next large following a reference voltage corresponding to the input, among the n reference voltages.

7. The parallel A/D converter of claim 1, wherein n reference voltages to be compared by the n comparators correspond to a voltage level distribution of the analog input signal.

8. The parallel A/D converter of claim 7, wherein the analog input signal is a reproduction signal of a recording/reproducing device.

9. The parallel A/D converter of claim 7, wherein the n reference voltages to be compared by the n comparators correspond to appearance frequencies of the digital output signals.

10. The parallel A/D converter of claim 7, wherein the n reference voltages to be compared by the n comparators correspond to characteristics of a communication line of a communication device that transmits the analog input signal.

11. A parallel A/D converter comprising:

a reference-voltage generation circuit for outputting m reference voltages ("m" is an integer of not less than two), each having different voltage values, in response to the bit precision of digital output signals;

m comparators, provided in correspondence with the m reference voltages, each comparing the magnitude of the corresponding reference voltage with that of an analog input signal;

n switch devices ("n" is an integer smaller than "m"), provided in correspondence with n reference voltages of the m reference voltages, each controlling the supply of the reference voltage and the analog input signal to the corresponding comparator; and an encoder for encoding outputs of the m comparators to output the digital output signals.

12. The parallel A/D converter of claim 11, further comprising:

a gain control circuit for outputting a control signal upon stabilization of the amplitude of the analog input signal, wherein each of the n switch devices stops the supply of the reference voltage and the analog input signal to the corresponding comparator in response to the control signal.

13. The parallel A/D converter of claim 11, further comprising:

a timing control circuit for outputting a control signal upon stabilization of the timing of sampling the analog input signal, wherein each of the n switch devices stops the supply of the reference voltage and the analog input signal to the corresponding comparator in response to the control signal.

14. A parallel A/D converter comprising:

a reference-voltage generation circuit for outputting m reference voltages ("m" is an integer of not less than two), each having different voltage values, in response to the bit precision of digital output signals;

m comparators, provided in correspondence with the m reference voltages, each comparing the magnitude of the corresponding reference voltage with that of an analog input signal;

m switch devices, provided in correspondence with the m reference voltages, each controlling the supply of the reference voltage and the analog input signal to the corresponding comparator;

a frequency distribution circuit for outputting a control signal on the basis of a frequency distribution of appearance frequencies of the digital output signals; and an encoder for encoding outputs of the m comparators to output the digital output signals, wherein each of the m switch devices stops the supply of the reference voltage and the analog input signal to the corresponding comparator in response to the control signal.

* * * * *